United States Patent
Li et al.

(10) Patent No.: US 10,510,956 B2
(45) Date of Patent: Dec. 17, 2019

(54) COUPLED QUANTUM DOT MEMRISTOR

(71) Applicant: OXFORD UNIVERSITY INNOVATION LIMITED, Oxford (GB)

(72) Inventors: Ying Li, Oxford (GB); Simon Benjamin, Oxford (GB); George Andrew Davidson Briggs, Oxford (GB); Jan Andries Mol, Oxford (GB)

(73) Assignee: Oxford University Innovation Limited, Oxford (GB)

( * ) Notice: Subject to any disclaimer, the term of this patent is extended or adjusted under 35 U.S.C. 154(b) by 0 days.

(21) Appl. No.: 16/095,150

(22) PCT Filed: Apr. 21, 2017

(86) PCT No.: PCT/GB2017/051122
§ 371 (c)(1),
(2) Date: Oct. 19, 2018

(87) PCT Pub. No.: WO2017/182826
PCT Pub. Date: Oct. 26, 2017

(65) Prior Publication Data
US 2019/0058117 A1    Feb. 21, 2019

(30) Foreign Application Priority Data
Apr. 22, 2016 (GB) .................................. 1607062.5

(51) Int. Cl.
*H01L 45/00*   (2006.01)
*G11C 13/00*   (2006.01)

(52) U.S. Cl.
CPC ........ *H01L 45/145* (2013.01); *G11C 13/0007* (2013.01); *H01L 45/1253* (2013.01); *H01L 45/1608* (2013.01); *G11C 2216/08* (2013.01)

(58) Field of Classification Search
CPC ............... H01L 45/145; H01L 45/1253; H01L 45/1608; H01L 45/04; G11C 13/0007; G11C 2216/08
(Continued)

(56) References Cited

U.S. PATENT DOCUMENTS

2004/0238812 A1    12/2004   Wasshuber
2011/0085381 A1*    4/2011   Ferrus ............... H01L 29/42328
                                                              365/185.18
(Continued)

FOREIGN PATENT DOCUMENTS

EP     1198008 A1    4/2002
EP     1262911 A1   12/2002
(Continued)

OTHER PUBLICATIONS

International Search Report and Written Opinion, PCT/GB2017/051122, dated Jul. 31, 2017 (14 pp.).
(Continued)

*Primary Examiner* — Fernando Hidalgo
(74) *Attorney, Agent, or Firm* — Eversheds Sutherland (US) LLP

(57) ABSTRACT

The present disclosure relates to novel memristive devices, uses thereof, and processes for their preparation. In a first aspect, the disclosure provides a quantum memristor, including a first quantum dot (QD1) which is capacitively coupled to a second quantum dot (QD2), a source electrode, a drain electrode, and a bath electrode, wherein the source electrode and the drain electrode are coupled via quantum tunneling to QD1 and the bath electrode is coupled via quantum tunneling to QD2, and wherein QD2 is capacitively coupled to either the source electrode or the drain electrode.

22 Claims, 7 Drawing Sheets

(58) Field of Classification Search
USPC .......................................................... 365/148
See application file for complete search history.

(56) References Cited

U.S. PATENT DOCUMENTS

| | | | |
|---|---|---|---|
| 2011/0096589 A1 | 4/2011 | Bratkovski et al. | |
| 2014/0197369 A1 | 7/2014 | Sheng et al. | |

FOREIGN PATENT DOCUMENTS

| | | |
|---|---|---|
| KR | 1020130021864 | 3/2013 |
| WO | 2013032488 A1 | 3/2013 |

OTHER PUBLICATIONS

Search Report, GB1607062.5, dated Sep. 30, 2016 (3 pp.).
Li, Ying, et al., A simple and robust quantum memristor, https://arxiv.org/abs/1612.08409, Dec. 26, 2016 (20 pp.).
Klymenko, M.V., et al., Operation of a quantum dot in the finite-state machine mode: single-electron dynamic memory, https://arxiv.org/abs/1603.03601, Mar. 11, 2016 (18 pp.).
Marent, A., et al., The QD-Flash: a quantum dot-based memory device, IOP Publishing, Semiconductor Science and Technology, Semicond. Sci. Technol. 26 (2011) 014026, doi:10.1088/0268-1242/26/1/014026 (7 pp.).
Chua, Leo O., The Missing Circuit Element, IEEE Transaction on Circuit Theory, vol. Ct-18, No. 5, Sep. 1971 (13 pp.).
Goan, Hsi-Sheng, et al., Continuous quantum measurement of two coupled quantum dots using a point contact: A quantum trajectory approach, Physical Review B, vol. 63, 125326, 2001 (12 pp.).
Ho, Yenpo, et al., Nonvolatile Memristor Memory: Device Characteriatics and Design Implications, Proceedings of the 2009 International Conference on Computer-Aided Design Digest of Technical Papers (6 pp.).
Strukov, Dmitri B., et al., The missing memristor found, Nature, vol. 453, May 1, 2008 (5 pp.).

* cited by examiner

COUPLED QUANTUM DOT MEMRISTOR

INTRODUCTION

The present invention relates to novel memristive devices, uses thereof, and processes for their preparation.

The devices of the invention have been made possible by the development of a new, generic, quantum-mechanical model of memristive systems which provides new insights into their behaviour. This model, described herein, opens the way to novel memristive devices which exploit behaviours explained for the first time by the new model. In particular, the new model has led to the surprising insight that certain behaviours which are often regarded as frustrations in experimental work may in fact be usefully harnessed as the basis of memristive function.

BACKGROUND

Memristive Systems are Generalisations of Memristors, which are Resistors with Memory.

Resistors, capacitors and inductors are the three fundamental circuit elements that are familiar from high school level electronics. In 1971 Leon Chua postulated a fourth two-terminal circuit element characterized by a relationship between charge and flux linkage. Predicting that conductance would depend on the history of current flow through it, he dubbed it memristor for memory and resistor. This is described in L. O. Chua, *Memristor—The Missing Circuit Element*, EEE Trans. Circuit Theory 18 507 (1971).

More recently, Strukov, Snider, Stewart and Williams published a theoretical article (Strukov et al., *The missing memristor found*, Nature 453, 80 (2008)) showing that memristive behaviour existed in previously observed resistance switching behaviour when "electronic and ionic transport are coupled", especially in nanoscale films. It remains controversial whether indeed this class of system implements the memristor as envisaged by Chua but the term has come to be used by many authors as a generic reference to 2-terminal non-volatile memory devices based on resistance switching, blurring the line with resistive random-access memory (RRAM). This meaning of the term is adopted herein, i.e. a "memristor" according to the invention is a 2-terminal non-volatile memory device based on resistance switching.

The resistance of a memristor depends on its history, i.e. on what current has passed through the memristive device previously. This results in a pinched hysteresis, or Lissajous loop. This time dependent current-voltage characteristic can then be incorporated into a circuit to serve as a memory, as described in, for example, *Nonvolatile memristor memory: device characteristics and design implications* by Ho et al., Proceedings of the 2009 International Conference on Computer-Aided Design, pages 485-490 (ISBN 978-1-60558-800-1, doi 10.1145/1687399.1687491), the contents of which are incorporated herein by reference.

Subsequent research has realised memristive behaviour in a wide variety of systems, and has identified applications where the memory effect may lead to dramatic advantages in simplicity and power versus conventional electronics. These range from ultra dense, low power memory envisaged as a successor to today's RAM and flash, through novel stateful logic processes, and even neuromorphic computing where the memristor is seen as a synthetic analog of a neuron.

As with many other electronic devices, the behaviour of memristive systems is increasingly affected by quantum phenomena as the device size shrinks to ever smaller dimensions. Memristors based on ionic motion can be scaled down to less than 10 nm, and other candidates of memristive systems include even smaller objects, e.g. molecules. At the nanoscale, electron transport through devices is strongly influenced by the discrete energy spectrum and interference effect, which may even emerge at room temperature in certain molecules. It is therefore crucial to understand the non-classical behaviour that emerges in nanoscale memristive systems.

For the purposes of the present invention, the terms "memristive device" and "memristive system" are employed interchangeably and are intended to refer to quantum memristive devices: that is, memristive devices whose characteristics and behaviour can be explained only at a quantum-mechanical level.

In quantum mechanics, a memristive device can be considered as a quantum open system: the internal state of the device interacts with the environment, typically the electrodes, such that the internal state affects the electron transport (the resistance), and the evolution of the internal state depends on external signals (current and voltage).

This effect (i.e. the fact that the device characteristics alter dramatically when the environment changes, e.g. via a change in the charge state in the immediate environment of the device) is frequently a frustration in experimental work. However, the present inventors have unexpectedly found that it may be usefully harnessed as the basis of memristive function.

An example of such an open quantum system is a pair of capacitively-coupled quantum dots (a "double quantum dot device" or "double dot device"), where only one dot participates in the electron transport while the other (called the control dot) controls the transport via the capacitive coupling. The environment (electrodes) is configured such that the evolution of the control dot depends on the applied voltage.

The term "capacitive coupling" is a well known term in the field of electronic circuit design and the conventional meaning is adopted herein. In brief, it means that energy is transferred by means of displacement currents induced by existing electric fields between nodes of a circuit or circuits. Further details can be found in standard electrical engineering or circuit design handbooks.

Quantum dots based on nanoparticles are well-known for optical applications owing to their bright, pure colours along with their ability to emit a wide variety of colours of light coupled with their high efficiencies, long lifetimes and high extinction coefficients. However, no quantum-dot-based memristive devices have been described up until now. To date, no purely quantum-mechanical memristors have been demonstrated; the present invention therefore represents the first implementation of a quantum-mechanical memristive device, and in particular the first implementation of a quantum-dot-based memristor.

A double quantum dot device exhibits current-voltage hysteresis curves, which are a characteristic property of memristive systems. However, unlike classical memristive systems, the current in quantum memristive systems shows stochastic behaviour and may not converge to a periodic curve under periodic driving due to quantum jumps between different values of the quantised conductance.

Room temperature operation of the devices of the invention could potentially be achieved in ultra-scale semiconductor devices or by using single-molecule transistors. While device geometries employing capacitive coupling between two quantum dots are known, the use of a double quantum dot system as a memristive device has not been explored to date and thus memristors based on capacitively-coupled double quantum dot systems have also been unknown before now.

The present invention provides a simple and practical scheme for realising memristive systems with quantum dots. The present invention harnesses a phenomenon that is commonly seen as a bane of nanoelectronics, i.e. switching of a trapped charge in the vicinity of the device, and demonstrates that this can be put to good use in the realisation of a quantum-dot-based memristive system. Quantum-dot memristive systems as described herein have hysteresis current-voltage characteristics and quantum jump induced stochastic behaviour.

Quantum dots (QDs) display unique electronic properties which are intermediate between those of bulk semiconductors and discrete molecules. Electrons in quantum dots are confined in a small space which leads to the quantum dot behaving as a "quantum box" similar to the well-known "particle in a box" model as described in, for example, *Molecular Quantum Mechanics* by P. W. Atkins and R. S. Friedman (Oxford University Press, $5^{th}$ ed. 2010). When the radius of the quantum dot is smaller than the exciton Bohr radius (the exciton Bohr radius is the average distance between the electron in the conduction band of the semiconductor and the hole it leaves behind in the valence band of the semiconductor), there is quantization of the energy levels according to Pauli's exclusion principle. The discrete, quantized energy levels of quantum dots relate their behaviour more closely to atoms than bulk materials. Generally, as the size of the quantum dot decreases, the difference in energy between the highest valence band and the lowest conduction band increases.

In many cases, quantum dots are tiny particles (nanocrystals) of metal or semiconducting material. Such particles typically have a diameter of about 2 to about 10 nm, and/or an overall content of about 10 to about 50 atoms or about 10 to about 50 molecules. The unique electronic properties of such particles are therefore partly the result of the unusually high surface-to-volume ratios of such particles. Quantum dots of the particulate (nanocrystalline) type may be used in the memristive devices of the present invention.

Particulate quantum dots can be classified into different types based on their composition and structure, as described below. All such quantum dots may suitably be applied in the devices of the present invention.

1. Core-Type Quantum Dots. These may be single component materials with uniform internal compositions, such as chalcogenides (selenides or sulfides) of metals like cadmium or zinc, for example CdSe or CdS. The electronic properties of core-type quantum dots can be fine-tuned by simply changing the particle size.

2. Core-Shell Quantum Dots. These comprise a core of a first semiconducting material surrounded by at least one shell of another, higher-band-gap semiconducting material such that the quantum dots comprise small regions of one material embedded in another with a wider band gap. These are known as core-shell quantum dots (CSQDs) or core-shell semiconducting nanocrystals (CSSNCs). For example, quantum dots with CdSe in the core and ZnS in the shell exhibit greater than 80% quantum yield in radiative electron-hole recombinations. Coating quantum dots with shells improves quantum yield by passivizing nonradiative recombination sites and also makes them more robust to processing conditions for various applications. This method has been widely explored as a way to adjust the photophysical properties of quantum dots.

3. Alloyed (multicomponent) Quantum Dots. Multicomponent quantum dots offer an alternative method to tune properties without changing crystallite size. Alloyed semiconductor quantum dots with both homogeneous and gradient internal structures allow tuning of the optical and electronic properties by merely changing the composition and internal structure without changing the crystallite size. For example, alloyed quantum dots of the compositions $CdS_xSe_{1-x}/ZnS$ of 6 nm diameter emit light of different wavelengths by just changing the composition (i.e. by varying x). Alloyed semiconductor quantum dots formed by alloying together two semiconductors with different band gap energies exhibit interesting properties distinct not only from the properties of their bulk counterparts but also from those of their parent semiconductors.

Within the scope of the present invention, quantum dots are not restricted to being particulate (atomic or molecular nanocrystalline) QDs such as those described above. In the memristive devices of the invention, a QD may be any structure which causes electron confinement in a region which behaves as a "quantum box", i.e. any structure which leads to quantisation of energy levels.

Thus, in certain embodiments of the invention, the quantum dots employed in the memristive devices of the invention may be single atoms or single molecules. Alternatively, the quantum dots may be nanocrystalline. Where atomic, molecular or nanocrystalline quantum dots are employed, these may be anchored to their respective electrode or electrodes using linker molecules which permit electron tunneling between the QD and the anchored electrode(s).

In certain embodiments of the invention the quantum dots may be metallic or semiconductor "islands" which may be lithographically or electrostatically defined. Alternatively the quantum dots may be formed by individual atoms, molecules or nanoparticles.

Thus, in certain embodiments of the invention, the quantum dots employed in the memristive devices of the invention may be regions of material which are formed from the same piece of material as at least one electrode (e.g. a single piece of material comprising a source electrode, drain electrode and a quantum dot, or a single piece of material comprising a reservoir electrode and a quantum dot). In such embodiments, although there is a continuum of material between at least one electrode and a quantum dot, a quantum dot may be defined as a region of that material which causes electron confinement locally such that the region behaves as a quantum box. For example, the quantum dot may be formed by creating constrictions in the material (e.g. regions in which the material is narrower) which alter the local electron transport properties of the material to create a tunneling barrier. Such barriers may be created, for example, by using notches in the material. Such constrictions or notches may be formed lithographically, for example by creating constrictions in a lithographic channel. These notches or constrictions create a tunneling barrier which causes the region of material on one side of that barrier to behave as a quantum dot and the region of material on another side of that barrier to behave as an electrode, such that electrons can travel between the quantum dot and the electrode only via quantum tunneling. Any suitable lithographic technique may be employed, such as electron beam or optical lithography, wet chemical etching, reactive ion etching or plasma etching. Suitable materials for use in such embodiments include metals, semiconductors such as Si or gallium arsenide, or two dimensional materials such as graphene.

In certain embodiments of the invention, the quantum dots may be regions of a continuous material which are caused to behave as quantum dots by the creation of electrostatically-induced tunnel barriers. These barriers act to separate the QD region from the remainder of the material such that the QD region acts as a quantum box and such that electrons can travel in and out of the QD region only via quantum tunneling. Such barriers can be employed in lithographically defined channels such as those described above, for example in place of constrictions or notches such that the QD region is defined by a gate electrode which alters the electrostatic properties of the material to induce QD behaviour instead of using a physical constriction to induce this. Electrostatically-induced tunnel barriers may also be employed to create one or more QD regions in a two-dimensional electron/hole gas such as a patterned semiconductor material or a semiconductor heterostructure.

Quantum Description of Memristive Systems

The following provides a generic description of a quantum mechanical memristive system.

Any voltage-controlled memristive system is defined by equations $$I = G(x, V, t)V, \quad (1)$$

$$\frac{dx}{dt} = f(x, V, t), \quad (2)$$

where the conductance G depends on the voltage V and the state parameter x. In such a memristive system, the evolution of the state is controlled by the voltage, and the state equation [Equation (2)] is assumed to have a unique solution for any initial condition.

For a quantum system, the state is described by a reduced density matrix ρ. If ρ is the state of the total system including both the system (device) and the environment (e.g. electrodes coupled to the device), the current going through the device reads $$I = Tr(\hat{I}\varphi), \quad (3)$$

where the current operator $\hat{I}$ is an operator of the total system. When the coupling between the system (device) and the environment is weak, the influence of the system on the environment is small, and the state of the total system is approximately a tensor product $\rho \approx \rho_S \otimes \rho_E$, where $\rho_S$ is the state of the system and $\rho_E$ is the state of the environment. Under the weak-coupling condition, the current is approximately $$I = Tr(\hat{I}_S \rho_S), \quad (4)$$

where $\hat{I}_S = Tr_E(\hat{I} \mathbb{1}_S \otimes \rho_E)$ is an operator of the device depending on the state of the environment. $\mathbb{1}_S$ is the identity matrix for the state of the system. Because the state of the environment depends on the voltage, i.e. electrochemical potentials in electrodes, the operator $\hat{I}_S$ is voltage-dependent.

For a memristive system, the current is zero whenever the voltage is zero, regardless of the state of the device, which distinguishes a memristive system from an arbitrary dynamical system. Therefore, if $I|_{V=0}=0$ is satisfied, equation (4) is a quantum-mechanical version of equation (1), in which the conductance G=I/V depends on both the voltage and the state of the device.

The evolution of a Markov open quantum system is given by the master equation $$\frac{d\rho_S}{dt} = \mathcal{L}(V)\rho_S, \quad (5)$$

which has a unique solution for any initial condition. Here, the generator $\mathcal{L}$ of the semigroup is determined by the state of the environment, i.e. the voltage V. Therefore, when the condition $I|_{V=0}=0$ is satisfied, equations (4) and (5) describe a memristive system in quantum mechanics (a quantum mechanical memristive system).

DESCRIPTION OF THE INVENTION

The present invention relates to memristive systems as defined above, i.e. quantum mechanical memristive systems, which may also be called "quantum memristive systems", "quantum resistive memory systems" or "quantum memristors". These terms ("quantum mechanical memristive systems", "quantum memristive systems", "quantum resistive memory systems" and "quantum memristors") are used interchangeably throughout the following description.

Quantum dots have discrete energy spectra due to electron confinement in all three spatial directions. Coulomb repulsion between electrons in a quantum dot leads to an increasing energy cost for adding more electrons to the dot. In the following discussion it is assumed for simplicity that the energy space between discrete states and the Coulomb repulsion energy are large enough so that each quantum dot can be treated as a single-level system, i.e. each dot has only two states: empty or occupied with one electron. This simplified model allows the behaviour of a memristive system to be mathematically described relatively concisely. However, the present invention is not limited only to those memristive devices which are precisely described by such a model. Thus, the present invention also encompasses memristive devices in which at least one quantum dot (or both quantum dots) behaves as a two-level system.

Memristive devices according to the invention are quantum memristive devices comprising two quantum dots, QD1 and QD2. The memristive devices of the invention further comprise a first electrode and a second electrode, which may also be referred to as "terminals". The first and second electrodes are coupled to the first quantum dot QD1 via quantum tunneling.

An embodiment of such a device is illustrated in FIG. 1(a). The first and second electrodes are coupled to QD1 via quantum tunneling with tunneling strength $\gamma_1$. The input is the voltage V applied on these two terminals, and the output is the current I going through QD1. The tunneling strength may be determined by employing one or more depletion gates, such as those shown as $LD_1$ and $RD_1$ in FIG. 1(b).

The labels L and R in the context of FIG. 1(a) denote left and right, respectively. However, this arrangement is purely illustrative and the terms L and R should be understood as being defined relative to one another with respect to the electrode function rather than denoting any absolute spatial arrangement. The present invention is not limited to the spatial arrangement shown in FIG. 1(a). Memristive devices in which the L and R electrodes are swapped, such that the electrode labelled L occupies the position shown as belonging to electrode R in FIG. 1(a) (and vice versa) are within the scope of the invention, as are devices in which the first and second electrodes have any other spatial arrangement with respect to one another and with respect to the quantum dots. Any spatial arrangement of QD1 and the electrodes is permissible, provided that a voltage V is applied across the first and second electrodes such that one electrode has a positive electrochemical potential (this is termed the source electrode or "electrode-L" or "L electrode") and the other a negative electrochemical potential (this is termed the drain electrode or "electrode-R" or "R electrode") with respect to QD1, and provided that both first and second electrodes are coupled to the first quantum dot QD1 with tunneling strength $\gamma_1$. For example, and without prejudice to the foregoing, electrode-L may be connected to a local gate of QD2. Such an embodiment is shown in FIG. 1(b), where electrode-L is connected to LD2 (a local gate of QD2) rather than to a capacitively coupled lead as shown in FIG. 1(a).

In a simplified, illustrative and non-limiting case, as shown in FIG. 1(a), the electrochemical potential in the first electrode (electrode-L) is $\mu_L=|e|V/2$ and the electrochemical potential in the second electrode (electrode-R) is $\mu R=|e|V/2$. When the energy level of QD1 is within the window defined by $\mu_L$ and $\mu_R$ [see FIG. 1(c)], electrons can go through QD1 via tunneling couplings with the terminals; when the energy level of QD1 is out of the window, the current decreases exponentially with the energy due to the Fermi-Dirac distribution of electrons in terminals. Therefore, the current can be switched on and off by changing the energy level of QD1. The energy level of QD1 can be changed by varying the potential at the first and/or second electrodes, and is also affected by the state of QD2 as described below. When QD1 is in the steady state, the current is $$I=|e|\gamma_1 f(E_1-\mu_L)-f(E_1-\mu_R)/2 \tag{6}$$

where $E_1$ is the energy of the QD1 level, $f(E)=[1+\exp(E/k_B T)]^{-1}$ (where $k_B$ is the Boltzmann constant), and T is the temperature.

Quantum dot QD1 is capacitively coupled to a second quantum dot QD2. Thus, the state of QD2 can affect the energy level of QD1. In a simplified, illustrative and non-limiting case, when the quantum dot QD2 is empty, the energy of the QD1 level is $E_1=0$; when QD2 is occupied, the energy of the QD1 level is raised to $E_1=E_C$ due to the capacitive coupling. Therefore, if the capacitive coupling is strong enough, i.e. $E_C>\max\{\mu_L, \mu_R\}$, the current is switched on and off depending on the occupation in QD2.

When QD1 is in the steady state, conductances are $$G_{ON}=|e|\gamma_1[f(-\mu_L)-f(-\mu_R)]/(2V), \tag{7}$$

$$G_{OFF}=|e|\gamma_1[f(E_C-\mu_L)-f(E_C-\mu_R)]/(2V), \tag{8}$$

respectively, for an empty and occupied QD2.

The relaxation time of QD1 is $\sim\gamma_1^{-1}$.

In certain embodiments of the invention, the voltage is switched with a frequency much smaller than $\gamma_1$. In such embodiments, the average conductance is approximately given by $G=(1-\bar{n}_2)G_{ON}+\bar{n}_2 G_{OFF}$, where $\bar{n}_2$ is the average occupation of QD2. One can find that the conductance is always finite, i.e. the condition $I|_{V=0}$ is satisfied. Usually $\gamma_1$ will be of the order of 1 THz, which corresponds to an energy of about 1 meV. This is much higher than the typical switching frequency of electronic circuits, which is of the order of 1 GHz or below.

In order to have the voltage-dependent evolution of the state, QD2 is capacitively coupled to one of the two terminals [e.g. in one embodiment electrode-L, as illustrated in FIG. 1(a), although in an alternative embodiment QD2 may be capacitively coupled to electrode-R.]. Hence, the energy level of QD2 is controlled by the voltage. It may be assumed that when QD1 is empty, the energy of the QD2 level is $E_2=\mu_L$.

In order to generate memristive behaviour, it is important that an electrode is coupled to both QD1 and QD2. This is illustrated in FIG. 1 where electrode-L is coupled to both QD1 and QD2, being coupled to QD1 by quantum tunneling and to QD2 by capacitive coupling. The electrode which is coupled to both QD1 and to QD2 may be referred to as "the source electrode", thus in the embodiment shown in FIG. 1, electrode-L is the source electrode. In an embodiment both QD1 and QD2 are coupled to the source electrode using quantum tunneling but preferably QD1 is coupled to the source electrode by quantum tunneling and QD2 is coupled to the source electrode capacitively. This is shown in the embodiment of FIG. 1.

The devices of the invention further comprise a "bath electrode" or "reservoir electrode", also termed "electrode-B" as shown by way of illustration in FIG. 1(a). This electrode is coupled to QD2 by quantum tunneling.

QD2 is coupled to the electrode-B with tunneling strength $\gamma_2$ [see FIG. 1(a)]. The electrode B is a bath of electrons, which allows the state of QD2 to be switched between empty and occupied. Due to the tunneling coupling, QD2 is emptied with the rate $$\gamma_{in}=\gamma_2(E_2)f(E_2-\mu_B) \tag{9}$$

and occupied with the rate $$\gamma_{out}=\gamma_2(E_2)[1-f(E_2-\mu_B)], \tag{10}$$

where $\mu_B=0$ is the electrochemical potential in the electrode-B. Here, it is assumed that the tunneling coupling strength depends on the energy of the QD2 level. Therefore, the evolution of QD2 is controlled by the voltage.

The material of which electrode-B is made, and the potential at which it is held, can affect the behaviour of the memristive device. For example, if $E_2$ is far above, or far below, the Fermi energy of electrode-B, the tunneling strength $\gamma_2$ could be a constant. If $E_2$ is far above the Fermi energy of electrode-B, then $\gamma_{in}$ will be zero. If $E_2$ is far below the Fermi energy, $\gamma_{out}$ will be zero. Thus, a requirement for a functioning double quantum dot memristor is that the distribution of electrons around energy $E_2$ varies with the value of $E_2$. This can be ensured by appropriate choice of the electrode-B material. Suitable electrode-B materials will be readily determined by the skilled person having regard to the mathematical model described herein and their knowledge of the band structure of conventional materials. Non-limiting examples of the material for electrode-B include, for instance, any suitable semiconductor, or a graphene nanoribbon.

In certain embodiments, electrode-B may be earthed. This may be desirable where the capacitive coupling between electrode-B and QD2 is otherwise not weak enough to be neglected.

Thus, viewed from a first aspect, the present invention provides a quantum memristor, comprising:
  a first quantum dot (QD1) which is capacitively coupled to a second quantum dot (QD2),
  a source electrode,
  a drain electrode, and
  a bath electrode,
wherein said source electrode and said drain electrode are coupled via quantum tunneling to QD1 and said bath electrode is coupled via quantum tunneling to QD2, and wherein QD2 is capacitively coupled to either the source electrode or the drain electrode.

Capacitive coupling and quantum-tunneling-mediated coupling are both functions of distance, among other variables. The tunneling current drops off exponentially with increasing distance (e.g. distance between a quantum dot and an electrode) whereas capacitive coupling varies linearly with distance, increasing linearly in strength as distance decreases. Preferably, where any two components are coupled to one another capacitively, there is negligible or zero coupling arising from quantum tunneling between those components, i.e. the components are coupled only by capacitive coupling. Thus, where capacitive coupling between two components (such as an electrode and a quantum dot) is required, coupling via quantum tunneling can easily be suppressed by choosing a distance between the two components at which the quantum tunneling current is negligible or zero yet an appreciable degree of capacitive coupling is retained.

QD1 and QD2 may independently be chosen from any of the known types of quantum dot. They may be identical to one another or different to one another, e.g. of the same material or of different materials. In particular, QD1 and QD2 may independently be the same size and/or shape as one another or may be different sizes and/or shapes to one another. QD1 and QD2 may independently be of the same material as one another or different material to one another. Possible materials for QD1 and/or QD2 include, but are not limited to, materials selected from among group IV semiconductors Si, Ge, or heterostructures of group IV semiconductors (SiGe); group III-V semiconductors, e.g. GaAs, InAs InSb or group III-V heterostructures; and 2D materials such as graphene and $WS_2$. Typical dimensions of QD1 and QD2 may range from about 5 nm to about 100 nm, e.g. 10 nm to 90 nm, such as 20 to 80 nm, 25 to 70 nm, 30 to 60 nm or 40 to 50 nm. QD1 and QD2 may independently be of the same size or of different sizes.

Thus, in an embodiment of the memristors of the invention, QD1 and QD2 are of the same material as one another.

In an embodiment of the memristors of the invention QD1 and QD2 are of different materials to one another.

In an embodiment of the memristors of the invention QD1 and QD2 are the same size and/or shape as one another.

QD1 and QD2 may be of the atomic, molecular or particulate or nanocrystalline type as described above. Alternatively they may be defined by constrictions or by electrostatically-induced tunneling barriers in a material such as a lithographically-defined channel or a two-dimensional electron/hole gas.

Thus in an embodiment the invention provides a quantum memristor as herein described wherein QD1, the source electrode and the drain electrode are formed from a single piece of material and wherein QD1 is defined by a first constriction and a second constriction in said single piece of material, said first constriction being located between QD1 and the source electrode and said second constriction being located between QD1 and the drain electrode; and wherein QD2 and the bath electrode are formed from a single piece of material and wherein QD2 is defined by a constriction in said single piece of material located between QD2 and the bath electrode; wherein said constrictions between QD1 and the source and drain electrodes and between QD2 and the bath electrode act as tunnel barriers. Preferably said constrictions are produced lithographically.

In a further embodiment the invention provides a quantum memristor as herein described wherein QD1 and QD2 are in lithographically-defined channels and wherein tunneling barriers between QD1, the source electrode and the drain electrode, and between QD2 and the bath electrode, are provided by gate electrodes.

In a further embodiment the invention provides a quantum memristor as herein described wherein QD1 and QD2 are regions in a two-dimensional electron/hole gas which are defined by barrier gates and plunger gates and wherein QD1 is separated from the drain and reservoir electrode by electrode gates. Preferably said two-dimensional electron/hole gas is a patterned semiconductor material or a semiconductor heterostructure.

In a further embodiment the invention provides a quantum memristor as herein described wherein QD1 and QD2 are each independently a single atom, molecule or nanoparticle.

The quantum-mechanical model of the memristive systems according to the invention will now be explored in further detail in order to explain the behaviour of the current I.

The Hamiltonian of a two-dot system reads $$H = \mu_L |0,1\rangle \langle 0,1| + (\mu_L + E_C)|1,1\rangle \langle 1,1|, \tag{11}$$

where $|n_1, n_2\rangle$ denotes the state of the two-dot system. $n_1$ is the occupation number of QD1 and $n_2$ is the occupation number of QD2. The energies of states $|0,0\rangle$ and $|1,0\rangle$ are zero.

The evolution equation of the two-dot system reads $$\frac{d\rho_S}{dt} = -\frac{i}{\hbar}[H, \rho_S] + \mathcal{L}_1 \rho_S + \mathcal{L}_2 \rho_S, \tag{12}$$

where $$\mathcal{L}_1 = \sum_{n_1, n_2 = 0,1} 2\gamma_1 [n_1 + (-1)^{n_1} f_1(n_2)] \times \mathcal{D}[\sigma_{1-n_1, n_2; n_1, n_2}], \tag{13}$$

and $$\mathcal{L}_2 = \sum_{n_1, n_2 = 0,1} \gamma_2 [n_2 + (-1)^{n_2} f_2(n_1)] \times \mathcal{D}[\sigma_{n_1, 1; n_1, n_2}], \tag{14}$$

Here, $$f_1(n_2) = [f(n_2 E_C - \mu_L) + f(n_2 E_C - \mu_R)]/2, \tag{15}$$

$$f_2(n_1) = f(\mu_L + n_1 E_C), \tag{16}$$

$$\mathcal{D}[\sigma]\rho_S = \sigma \rho_S \sigma^\dagger - \frac{1}{2}\{\sigma^\dagger \sigma, \rho_S\}, \tag{17}$$

and $$\sigma_{n_1', n_2'; n_1, n_2} = |n_1', n_2'\rangle \langle n_1, n_2|. \tag{18}$$

Equation (12) is the explicit form of Equation (5) for a two-dot system. Equations (5) and (12) describe the evolution of the memristive system.

The rate equation for the occupation number of QD1 is $$\frac{d\bar{n}_1}{dt} = |e|^{-1}(I_L - I_R), \tag{19}$$

where $I_L$ is the current from the electrode-L to QD1 and $I_R$ is the current from QD1 to the electrode-R. In the steady state, $$\frac{d\rho_S}{dt} = 0 \text{ and } I_L = I_R.$$

In the case that the voltage is switched with a frequency much smaller than $\gamma_1$, QD1 is approximately the steady state all the time, i.e. $\frac{d\rho_S}{dt} \approx 0$, and the difference between $I_L$ and $I_R$ can be neglected. Currents are given by $$I_L = E_{n_1,n_2=0,1} |e|\gamma_1 [n_1(-1)^{n_1} + f(n_2 E_C - \mu_L)] \times Tr(\sigma_{n_1,n_2;n_1,n_2\rho_s}) \quad (20)$$

and $$I_R = -\Sigma_{n_1,n_2=0,1} |e|\gamma_1 [n_1(-1)^{n_1} + f(n_2 E_C - \mu_R)] \times Tr(\sigma_{n_1,n_2;n_1,n_2\rho_s}). \quad (21)$$

In the numerical simulations described by way of non-limiting examples herein, the condition has been taken that $I=(I_L-I_R)/2$.

The characteristic feature of a memristive system is thus the hysteresis current-voltage curve for a periodic input. The input signal may be an oscillatory voltage applied on electrodes L and R, for example. In the limit of low input frequency, the device is always in the steady state, which usually only depends on the instantaneous voltage, hence I is usually a single-valued function of V. It is similar in the limit of high input frequency, in which case the state of the device is only determined by the initial state, because the time evolution is negligible during finite periods. However, for a moderate input frequency, the state cannot achieve the steady state of the instantaneous voltage before the voltage changes and thence evolves periodically, which results in a double-valued I-V function, i.e. the I-V curve is a Lissajous figure with two loops jointed at (I=0, V=0).

In the quantum-dot memristive systems of the invention, QD2 provides the memory of the device, and the evolution of QD2 is determined by the electrode-B. If the electrode-B has an energy gap in the spectrum (i.e. a band gap between the valence and conduction bands, which may also be called a "gapped spectrum"), as illustrated in FIG. 1(d), QD2 can be loaded with an electron only when the energy level is below the energy gap and unloaded only when the energy level is above the energy gap. Therefore, driving the energy level of QD2 with a periodic voltage, the conductance is $G_{ON}$ if the energy level is moving downward and $G_{OFF}$ if the energy level is moving upward. This mechanism results in a double-valued I-V function as illustrated by way of a non-limiting example in FIG. 2A(a), in which it is assumed for purposes of simplification and illustration that the tunneling coupling between QD2 and the electrode-B is $$\gamma_2(E_2) = \tilde{\gamma}_2 \left[ \theta\left(-\frac{\Delta E}{2} - E_2\right) + \theta\left(E_2 - \frac{\Delta E}{2}\right) \right].$$

Here, $\Delta E$ is the energy gap, and $\theta(E)$ is the Heaviside step function, The energy gap in the electrode-B is not essential. At a finite temperature, energy-dependent loading and unloading rates of QD2 [Eqs. (9) and (10)] can be caused by the Fermi-Dirac distribution of electrons in the electrode-B. The I-V curve for a closed energy gap, i.e. $\Delta E=0$ and $\gamma_2(E_2)=\tilde{\gamma}_2$, is shown in an illustrative manner in FIG. 2A(b), which also has the hysteresis feature. Thus, in some embodiments, electrode B has a closed energy gap (i.e. does not have a gapped spectrum). However, the performance of the device may be better if electrode-B does have an energy gap. Therefore in preferred embodiments electrode-B has a gapped spectrum. Without the energy gap, $\tilde{\gamma}_2$ needs to be weak enough the relaxation time of QD2 is longer than the period of the driving signal, otherwise the hysteresis disappears (see FIG. 2B(a)). $\tilde{\gamma}_2$ also cannot be too weak: if $\tilde{\gamma}_2$ is too weak and the evolution of QD2 is much slower than the driving signal, the state of QD2 will be frozen and the conductance will be the same regardless of the direction that the voltage is swept in. In both cases ($\tilde{\gamma}_2$ too weak or not weak enough) the hysteresis will dim when the temperature increases. The hysteresis relies on the energy-dependent couplings $\gamma_{out}$ and $\gamma_{in}$. Without the energy gap, the energy-dependent coupling is due to the Fermi-Dirac distribution, which becomes flattened when the temperature increases. In the presence of an energy gap, $\gamma_2(E_2)$ always varies significantly at edges of the gap. However, if the temperature is higher than the gap, $\gamma_{out}$ and $\gamma_{in}$ are similar on both sides of the gap, i.e. the state of QD2 does not evolve significantly when the energy level is swept from one side of the gap to another.

Thus, in certain embodiments, the present invention provides a quantum memristor as described herein, wherein the bath electrode has a nonzero energy gap. In further embodiments, the present invention provides a quantum memristor as described herein, wherein the bath electrode has no energy gap.

I-V curves in FIG. 2 are ensemble averages of many periods, in which the average current varies "continuously". Because the instantaneous conductance is quantised and only has two possible values $G_{ON}$ and $G_{OFF}$, the instantaneous current could be different from the average value and change stochastically due to quantum jumps between the empty and occupied states of QD2. FIG. 3, shows an illustrative, non-limiting simulation of the instantaneous current in such cases, simulated using the quantum trajectory method as described by Goan et al., *Continuous quantum measurement of two coupled quantum dots using a point contact: A quantum trajectory approach*, Phys. Rev. B 63, 125326 (2001).

If the electrode-B has an energy gap, quantum jumps only occur when the energy level of QD2 is around the edge of the gap, and most of the time the state of QD2 is determined [also see FIG. 2A(a)], i.e. the instantaneous current and the average current are basically the same. However, if the energy gap of the electrode-B is closed, as shown in FIG. 3(b), the occupation of QD2 is probabilistic in about 50% of cases [see FIG. 2A(b)], hence the difference between the instantaneous current and the average current is more apparent. Because of the stochastic jumps, it can be expected that the instantaneous current never converges to a periodic curve. Experimental data shown in FIG. 3(d) confirmed that the position of the charge transitions was not the same in each voltage sweep, and the instantaneous and average currents are not equal. While the occurrence of quantum jumps is an intrinsic feature of quantum-mechanical memristive devices, it might not be desirable for all applications. Thus, in preferred embodiments of the invention, the bath electrode (electrode-B) has a nonzero energy gap. It should be noted however that even when electrode-B does not have an energy gap the average current trace can be recovered within a single period by placing several (i.e. two or more) double-quantum-dot systems in parallel. The double-quantum-dot-systems may be placed in parallel by connecting each double-quantum-dot system to the same electrodes L and R. This ensures that the overall current from L to R is the average current of all the connected double-quantum-dot systems. Thus, in an embodiment, the present invention provides a multiple quantum-dot memristor comprising two or more quantum memristors as described herein which are arranged in parallel. Preferably in such embodiments the bath electrode of at least one of said two or more quantum memristors has an energy gap of zero. In certain embodiments the bath electrode of each of said two or more quantum memristors has an energy gap of zero. When the tunneling coupling of QD1 is weak, the shot noise (i.e. the variation in observed average values of I from one measurement to another, arising due to unavoidable natural experimental error and fluctuations) modifies I-V curves. FIG. 4 illustrates a non-limiting numerical simulation of the tunneling of electrons through QD1. Here it can be found that, even in a single trial, the asymmetry of the electron-count distribution in one period reflects the double-valued I-V characteristic of the memristive system. FIG. 4 is an idealised, theoretical simulation; without wishing to be bound by theory, it is noted that, in a real circuit, shot-noise as illustrated in FIGS. 4(a) and (c) is unlikely to be observed. Instead of stochastic jumps, a smooth stochastic current would instead be observed due to the finite response time of the real circuit.

The characteristic hysteresis feature can also be caused by a finite tunneling coupling between two quantum dots. Due to the tunneling coupling, the orbit of QD2 is extended and overlaps with QD1, such that QD2 could also be coupled to the two terminals (electrodes L and R). If the interdot tunneling rate is larger than $\gamma_2$, tunneling to QD1 provides an alternate relaxation path for QD2, and the two terminals will replace the role of electrode-B. However, since $\gamma_1$ is generally faster than $\gamma_2$, QD2 will achieve the instantaneous equilibrium state very quickly, suppressing the hysteresis effect. Therefore, in such embodiments, it is necessary to keep the interdot tunneling rate low, such that the relaxation rate of QD2 is comparable with the driving frequency, and hysteresis can be observed. Experimentally, this may be achieved by grounding a gate between the two dots, creating a large tunnel barrier which suppresses interdot tunneling. When the relaxation rate of QD2 is comparable with the driving frequency, hysteresis is expected. Thus in some embodiments of the invention, the bath electrode has a zero energy gap and QD1 and QD2 are coupled to one another via quantum tunneling, preferably wherein the tunneling frequency is from about 5 Hz to about 50 Hz, e.g. about 8 Hz to about 33 Hz, such as about 10 Hz to about 25 Hz.

Viewed from a further aspect the present invention provides the use of a quantum dot in the production of a quantum memristor or a multiple quantum-dot memristor as defined herein.

Memristors find particular application as components of computer memory and/or storage media, and therefore in a further aspect the present invention provides a computer-readable storage medium comprising at least one quantum memristor or at least one multiple quantum-dot memristor as defined herein.

The quantum memristors of the invention and the multiple quantum-dot memristors as described herein can be employed for the storage of information. The information may be binary data. For example when QD2 is occupied this may correspond to a "1" and when QD2 is unoccupied this may correspond to a "0" in binary language. Alternatively when QD2 is occupied this may correspond to a "0" and when QD2 is unoccupied this may correspond to a "1" in binary language. However, the data need not necessarily be binary. Due to the unique properties of memristors, whose resistance depends on its history (i.e. on what current has passed through the memristive device previously), memristors can also be used to store non-binary information. Such non-binary information may be, for example, quantum information. The basic unit of quantum information is the qubit. Unlike discrete information such as binary information, qubits are continuous-valued. The state of a qubit can be regarded as a quantum superposition of binary states 0 and 1. Thus, a qubit can be employed to store more than one bit of information at a time, for example to store two bits simultaneously.

Thus in a further aspect the invention provides the use of a quantum memristor according to the invention or a multiple quantum-dot memristor according the invention for the storage of information. Such information may be binary data, as described above, or may be non-binary information (preferably quantum information). The storage of information using a quantum memristor or multiple quantum-dot memristor according the invention finds particularly suitable application in computer systems and therefore in an embodiment the storage of information is the storage of information in a computer system, for example in a Random Access Memory (RAM) module. As the memristors of the invention exploit quantum-mechanical effects for their operation and for the storage of information, and are capable of storing quantum information, they are suitable for use in quantum computing systems and therefore in certain embodiments the memristors of the invention may be used for the storage of data (preferably quantum information) in a quantum computer.

In a further aspect the present invention provides a method for the storage of information in a quantum memristor, the method comprising:

providing a quantum memristor as herein defined wherein QD2 has a first occupancy level;

and applying a voltage across the first and second electrodes to cause the occupancy level of QD2 to change to a second occupancy level;

wherein changing the occupancy level of QD2 from the first to the second occupancy level corresponds to the storage of at least one bit of information.

In an embodiment the first occupancy level of QD2 may correspond to QD2 being unoccupied and the second occupancy level of QD2 may correspond to QD2 being occupied, such that changing from the first to the second occupancy level corresponds to adding an electron to QD2. In an alternative embodiment the first occupancy level of QD2 may correspond to QD2 being occupied and the second occupancy level of QD2 may correspond to QD2 being unoccupied, such that changing from the first to the second occupancy level corresponds to removing an electron QD2.

In one embodiment, the information is binary information and thus the method comprises:

providing a quantum memristor as herein defined wherein QD2 has a first occupancy level;

and applying a voltage across the first and second electrodes to cause the occupancy level of QD2 to change to a second occupancy level;

wherein one of said first and said second occupancy levels of QD2 corresponds to a 1 in binary language and the other of said first and said second occupancy levels of QD2 corresponds to a 0 in binary language.

In an embodiment the first occupancy level corresponds to a 1 and the second occupancy level to a 0.

In an embodiment the first occupancy level corresponds to a 0 and the second occupancy level to a 1.

In an alternative embodiment, the information is quantum information and thus at least one bit of information is stored in at least one qubit. Since a qubit can store more than one bit of information, it is possible to use (for example) a single qubit to store more than one bit of information, thus the total number of bits of information stored in such an embodiment does not necessarily correspond to the number of qubits.

In one embodiment, the method therefore comprises:

providing a quantum memristor as herein defined wherein QD2 has a first occupancy level;

and applying a voltage across the first and second electrodes to cause the occupancy level of QD2 to change to a second occupancy level;

wherein changing the occupancy level of QD2 from the first to the second occupancy level corresponds to the storage of at least one qubit.

The methods of the invention may thus be used to store information in a computer system, including in quantum computers, as described above.

The invention will now be described in more detail in the following non-limiting Examples and Figures, in which:

FIG. 1 illustrates a quantum-dot memristive system according to the invention. FIG. 1(a) shows a schematic of the structure of the device and FIG. 1(b) shows an SEM image of one experimental embodiment of such a device. FIG. 1(c) shows the relationship between the energies of electrodes L and R and quantum dot QD1 when a voltage is applied. FIG. 1(d) shows the relationship between the energy levels of the electrode B and of quantum dot QD2, assuming a nonzero energy gap.

EXAMPLE 1

Figure 1:
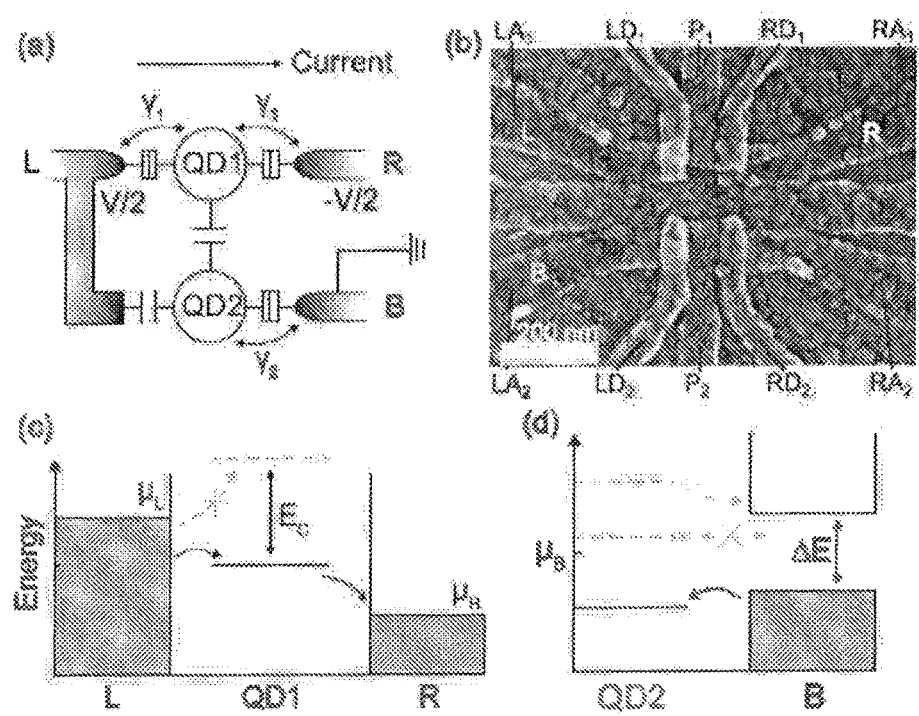

FIG. 1 illustrates a schematic of a quantum-dot memristive system according to the invention. As shown in FIG. 1(a), the device has two terminals: electrode-L and electrode-R. When a voltage V is applied on the device, electrochemical potentials in these two electrodes are respectively $\mu_L=|e|V/2$ and $\mu R=-|e|V/2$. The two terminals are coupled to the quantum dot QD1 via tunneling with the strength $\gamma_1$, hence current can go through the device via QD1. The quantum dot QD2 is capacitively coupled to QD1 and to the electrode-L and is coupled to electrode-B via tunneling with the strength $\gamma_2$. The electrochemical potential in the electrode-B is $\mu_B=0$.

FIG. 1(b) is an SEM image showing an experimental embodiment of a memristive system according to the invention. Three layers of aluminium gates were used to define a capacitively coupled pair of quantum dots in undoped silicon. The center-to-center distance between the two dots was ~140 nm. Labels $LA_1$, $LD_1$, $P_1$, $RD_1$, $RA_1$, $LA_2$, $LD_2$, $P_2$, $RD_2$, $RA_2$ label the different gates. Labels "L", "R" and "B" (superimposed on the image) indicate the leads accumulated in the Si. For each dot there were two accumulation gates (LA, RA), two depletion gates (LD, RD), and a plunger gate (P). A dot was formed under each plunger gate where it intersected the two accumulation gates. In this particular embodiment, electrode-L was connected to a local gate of QD2 (i.e. LD2) rather than to a capacitively coupled lead as shown in FIG. 1(a).

The current of a memristive system according to FIG. 1(a) or 1(b) is switched on when the energy level of QD1 is between $\mu_L$ and $\mu R$ and off when the energy level of QD1 is above max$\{\mu_L,\mu R\}$ or below min $\{\mu_L, \mu R\}$. This is shown in FIG. 1(c).

If there is an energy gap around the Fermi energy in the spectrum of the electrode-B of a memristive system according to FIG. 1(a) or 1(b), as shown in FIG. 1(d), QD2 can be loaded with an electron only when the energy level is lower than the gap and unloaded only when the energy level is above the gap.

EXAMPLE 2

FIG. 2 illustrates simulated current-voltage curves of a quantum-dot memristive system according to the invention derived from a periodic voltage.

Figure 2A:
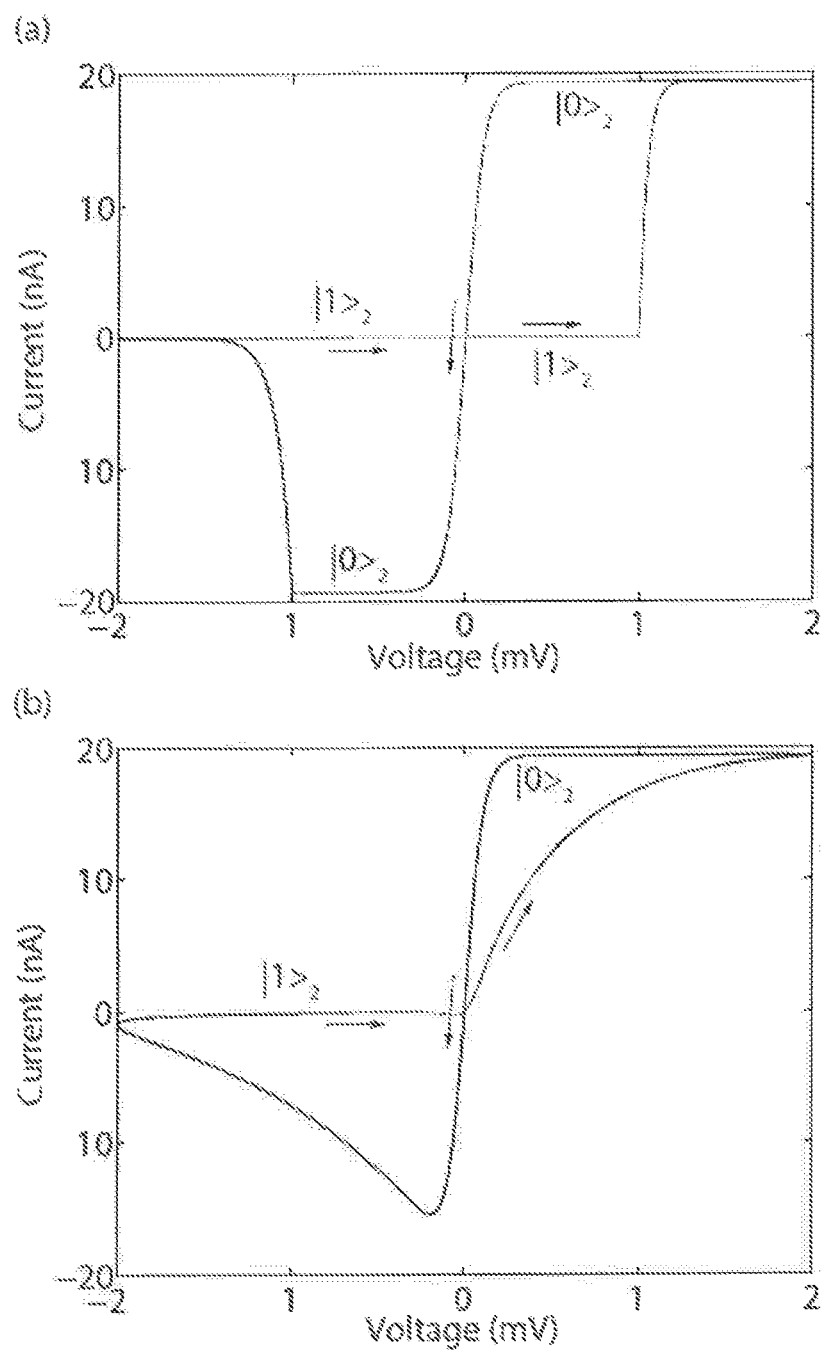
FIGS. 2A and 2B illustrate simulated current-voltage curves of a quantum-dot memristive system according to the invention derived from a periodic voltage.

In the simulations shown in FIGS. 2A(a) and 2A(b), the voltage is in the form $V(t)=V_A \cos \omega t$, where $V_A=2$ meV and $\omega=2\pi \times 1$ MHz. The temperature is T=0.3 K, the capacitive coupling between the two quantum dots QD1 and QD2 is $E_C=10$ meV, the tunneling coupling of QD1 is $\gamma_1=1$ meV, and the lever arm of the electrode-L gating QD2 is 1. (The lever arm is the ratio between the shift of energy level $E_2$ and the applied voltage, multiplied by the charge of an electron).

In the simulation shown in FIG. 2A(a), the electrode-B has an energy gap $\Delta E=1$ meV centered at the energy 0, and the tunneling coupling of QD2 is $\tilde{\gamma}_2=1$ μeV. When the energy level of QD2 is within the energy gap, i.e. $V \in [-1$ meV, 1 meV], QD2 is empty ($|0\rangle_2$) when the voltage is decreasing and occupied ($|1\rangle_2$) when the voltage is increasing.

In the simulation shown in FIG. 2A(b), the electrode-B has a closed energy gap, i.e. $\Delta E=0$, and the tunneling coupling of QD2 is $\tilde{\gamma}_2=0.1$ μeV. QD2 is likely empty when the voltage is decreasing but still positive, occupied when the voltage is increasing but still negative and in a mixed state in other cases. Currents are obtained by numerically solving the master equation as described herein.

Figure 2B:
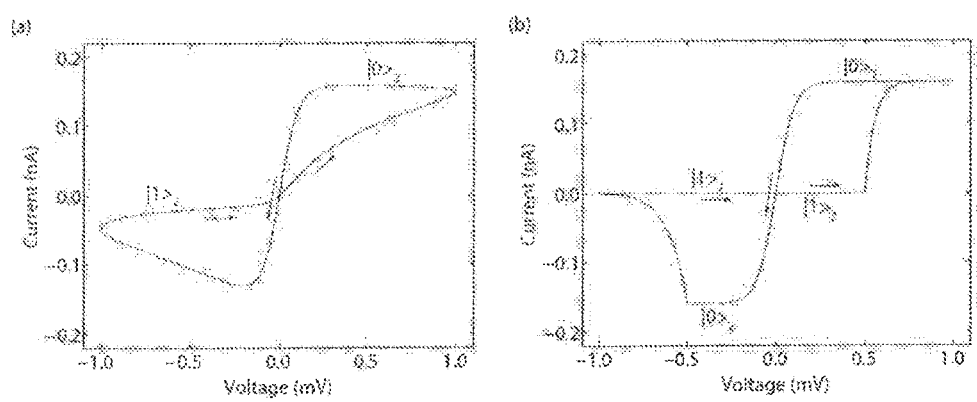

In the simulations shown in FIGS. 2B(a) and 2B(b), the voltage is in the form $V(t)=V_A \cos \omega t$, where $V_A=1$ meV and $\omega=2\pi \times 1$ MHz. The temperature is T=0.3 K, the capacitive coupling between the two quantum dots QD1 and QD2 is $E_C=1$ meV, the tunneling coupling of QD1 is $\gamma_1=2$ GHz, and the lever arm of the electrode-L gating QD2 is 1. Average current through QD1 is obtained by solving the master equation.

In the simulation shown in FIG. 2B(a), the electrode-B has a closed energy gap, i.e. $\Delta E=0$, and the tunneling coupling of QD2 is $\tilde{\gamma}_2=10$ Hz. QD2 is likely empty ($|0\rangle_2$) when the voltage is decreasing but still positive, occupied ($|1\rangle_2$) when the voltage is increasing but still negative and in a mixed state in other cases.

In the simulation shown in FIG. 2B(b), the electrode-B has an energy gap $\Delta E=0.5$ meV centered at the energy 0, and the tunneling coupling of QD2 is $\tilde{\gamma}_2=100$ Hz. When the energy level of QD2 is within the energy gap, i.e. $V \in [-0.5$ meV, 0.5 meV], QD2 is empty ($|0\rangle_2$) when the voltage is decreasing and occupied ($|1\rangle_2$) when the voltage is increasing.

EXAMPLE 3

Figure 3:
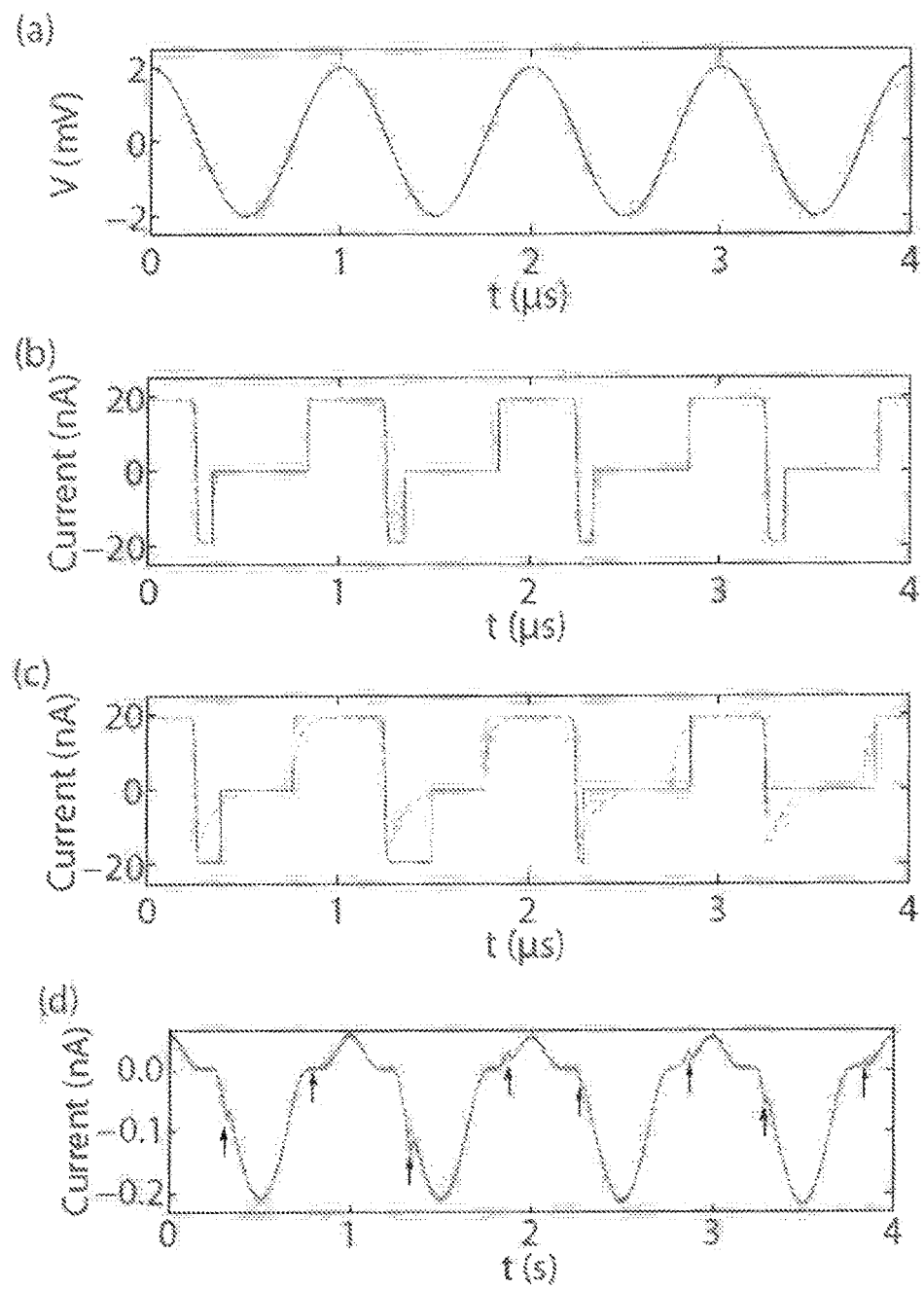
FIG. 3 illustrates quantum trajectory simulations of the instantaneous current in a quantum-dot memristive system according to the invention (FIGS. 3(a), (b) and (c)) and experimental data (FIG. 3(d)).

FIG. 3 illustrates quantum trajectory simulations of the instantaneous current in a quantum-dot memristive system according to the invention. Parameters are the same as described in Example 2.

FIG. 3(a) illustrates the voltage applied on the two terminals as a function of time.

FIGS. 3 (b) and (c) illustrate the current which is produced by the voltage illustrated in (a). The energy gap in the electrode-B is open (i.e. non-zero) in (b) and closed (i.e. zero) in (c). The instantaneous current (solid curve) is different from the average current (dashed curve) due to quantum jumps, which correspond to sudden changes of the instantaneous current.

FIG. 3(d) shows experimental data which was recorded for a working embodiment (as shown in FIG. 1(d) and described in further detail in Example 9). The solid curve is the instantaneous current and the dashed curve is the current averaged over 10 sweeps. Arrows indicate the position of abrupt current jumps. The jump positions varied stochastically from sweep to sweep, consistent with the expected behaviour of quantum jumps.

EXAMPLE 4

Figure 4:
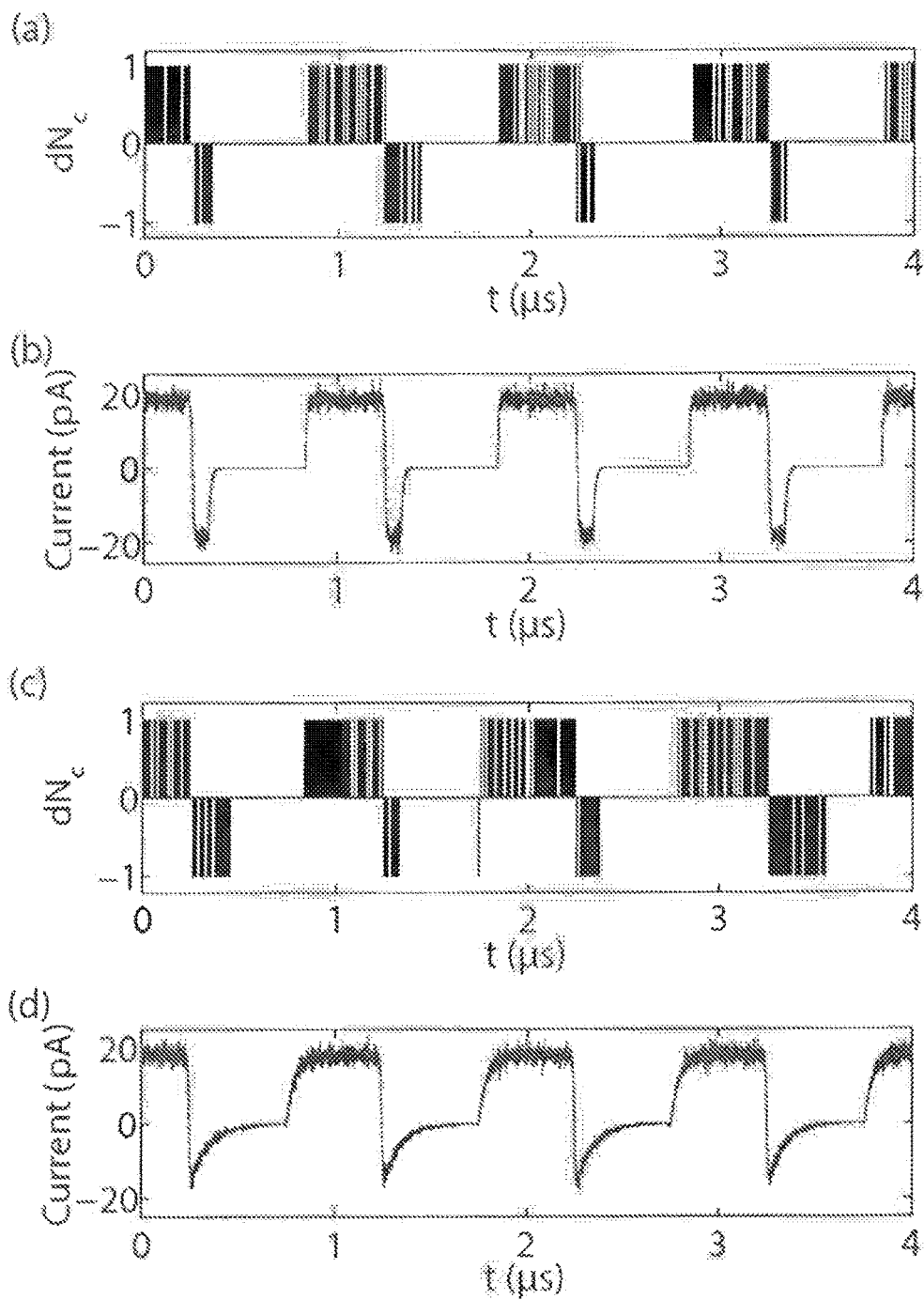
FIG. 4 illustrates quantum trajectory simulations of electron tunnelings in a quantum-dot memristive system according to the invention.

FIG. 4 illustrates quantum trajectory simulations of electron tunnelings in a quantum-dot memristive system according to the invention. The tunneling coupling of QD1 is $\gamma_1=1$ μeV, and other parameters are the same as described in Example 2. The energy gap in the electrode-B is open in (a) and (b) and closed in (c) and (d).

FIGS. 4(a) and 4(c) illustrate the count of electrons tunneling from QD1 to electrode-R in a single trial.

FIGS. 4(b) and 4(d) illustrate the averaged current obtained from 1000 trials (solid curve) which converges to the dashed curve when the number of trials goes to infinity.

EXAMPLE 5

Figure 5:
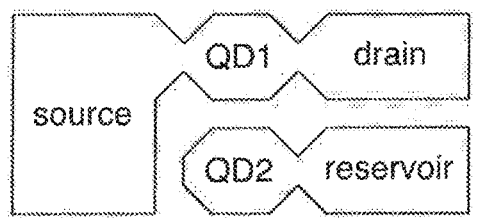
FIG. 5 illustrates a lithographically-defined quantum memristive device according to the invention.

FIG. 5 illustrates a lithographically defined quantum memristive device in which barriers to QD1 and QD2 are formed by lithographically defined notches (constrictions) in the material, which may be a metal or a semiconductor material such as silicon or gallium-arsenide, or a two-dimensional material such as graphene.

Devices are lithographically defined using electron beam or optical lithography and wet chemical etching, reactive ion etching or plasma etching. The QDs are formed between tunnel barriers formed by constrictions (notches) in the channel. The devices can be fabricated from metal or semiconductor material such as silicon, or gallium-arsenide, or two-dimensional materials such as graphene.

EXAMPLE 6

Figure 6:
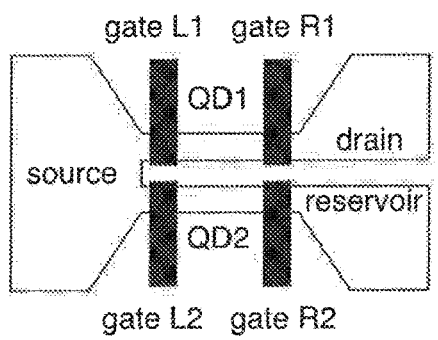
FIG. 6 illustrates an electrostatically-defined quantum memristive device according to the invention.

FIG. 6 illustrates an electrostatically defined quantum memristive device. Devices of this type are defined by tunnel barriers which are electrostatically induced by gate electrodes. In the embodiment shown, QDs are formed in lithographically defined channels defined by tunnel barriers which are electrostatically induced by gate electrodes.

Gates L1, L2 and R1, R2 define tunnel-barriers to QD1 and QD2 which are formed in the channel between source and drain/reservoir electrodes. The device can be formed in patterned semiconductor materials or semiconductor heterostructures.

EXAMPLE 7

Figure 7:
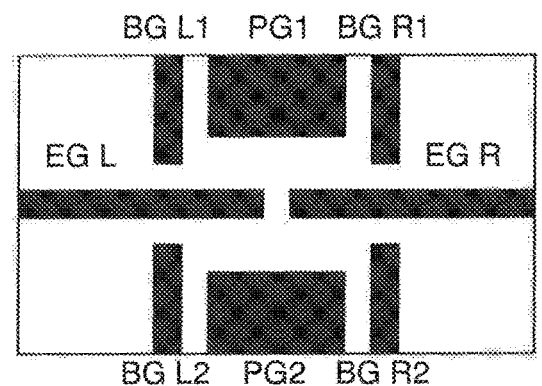
FIG. 7 illustrates a further electrostatically-defined quantum memristive device according to the invention.

FIG. 7 illustrates a further example of an electrostatically defined quantum memristive device. Devices of this type are defined by tunnel barriers which are electrostatically induced by gate electrodes. In the embodiment shown, QDs are formed in a two-dimensional electron/hole gas. Barrier gates BG L1, BG L2, BG R1 and BG R2, and plunger gates PG1 and PG2 define QD1 and QD2 in a two-dimensional electron gas (2DEG). Electrode gates EG L and EG R form the barrier between the drain and reservoir electrode. The device can be formed in patterned semiconductor materials or semiconductor heterostructures.

EXAMPLE 8

Figure 8:
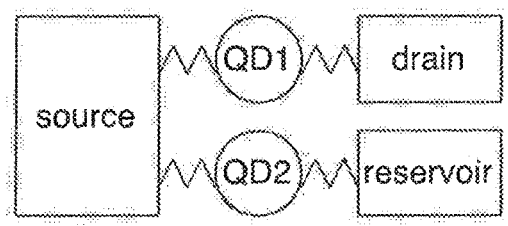
FIG. 8 illustrates a quantum memristive device according to the invention in which the QDs are formed by individual atoms, molecules or nanoparticles.

FIG. 8 illustrates a quantum memristive device according to the invention in which the QDs are formed by individual atoms, molecules or nanoparticles. Atoms can be placed using ion-implantation or STM lithography. Molecules and nanoparticles can be anchored to the source, drain and reservoir electrode using linker groups.

EXAMPLE 9

Devices according to the invention were fabricated and an example of such a device is shown in FIG. 1(b). This device employed a capacitively coupled pair of silicon metal-oxide-semiconductor (MOS) quantum dots. The two terminals of the memristive system were electrodes L and R, which were formed beneath aluminium accumulation gates $LA_1$ and $LA_2$. These terminals were coupled to the quantum dot QD1 with tunneling strengths that were determined by the depletion gates $LD_1$ and $RD_1$.

In this device the energy gap in electrode-B was zero. To form QD2, both depletion gates $LD_2$ and $RD_2$ were lowered to ~0.1 V, forming high tunnel barriers. Since direct transport through QD2 cannot be measured with such high barriers, the hysteresis in the QD1 current was used to estimate the tunnel rate at ~10 Hz. In this gate range, it was observed that $LD_2$ was able to modulate the tunnel rate, whereas $RD_2$ was not. From this it was concluded that $QD_2$ was formed closer to the left side and tunneling from the right lead was absent (hence electrode-B is indicated to the left of QD2 in FIG. 1(b)). To control the QD2 level $E_2$ during the AC voltage sweep, gate $LD_2$ was also used, since it was strongly coupled to the dot. While $LD_2$ was used for both the AC sweep and for tuning the tunnel rate $\gamma_2$, it was noted that the tunnel rate was practically insensitive to $LD_2$ over the AC sweep range of millivolts. It is important to note that in this particular experimental embodiment, a voltage divider was used to increase the magnitude of the AC voltage on $LD_2$ by a factor of 10 compared to electrode-L. That is, a 10 mV AC signal was applied to $LD_2$ but was reduced to $V_A=1$ mV on electrode-L by the divider. This was because the lever arm between $LD_2$ and QD2 was of the order of 0.2, but the hysteresis effect is more evident when the potential felt by both dots is comparable.

These devices were fabricated using undoped silicon with a thermal oxide of 300 nm, which was etched down to a thickness of 12 nm in the area where the dots were patterned. Ion implantation of phosphorus with an energy of 12 keV was performed through a photomask to create degenerately doped source/drain contacts. Following implantation, the resist mask was stripped, and the chip was annealed at 950° C. in $N_2$ to remove damage from the implantation process, and to activate the dopants. To prevent shorts between these ion implanted regions and subsequent metal gates, a 6 nm layer of $Al_2O_3$ was deposited by atomic layer deposition. Gates to define the quantum dots were then fabricated on the substrate using three layers of Al gates. Each layer was patterned using electron beam lithography with a PMMA mask, and Al deposited using an electron beam evaporator with a deposition rate of 1 Å/s. Following liftoff of the excess metal, the devices were exposed to a 25 W $O_2$ plasma at 150° C. for two minutes to form an oxide layer at the metal surface. This oxide provided electrical insulation between gate layers, and it was found that this process resulted in gate-gate breakdown voltage greater than 4 V. The first gate layer was a screening layer which controlled where subsequent gates would form an accumulation layer at the $Si/SiO_2$ interface. The screening gates defined two horizontal channels with a separation of ~140 nm. Layer two were the accumulation gates used to form the conducting channel between the dots and the source/drain contacts, as well as the plunger gates which controlled the chemical potentials of the dots. A further layer was deposited last and was used to form tunnel barriers. After all gate layers were deposited, the chip was annealed in forming gas at 220° C. for 1 hour, which was found to be critical for obtaining clean and reproducible device characteristics in this particular embodiment.

Measurements of device performance were performed. These measurements were carried out in a dilution refrigerator with a lattice temperature of 25 mK. DC voltages were applied to the device using a multi-channel custom voltage source based on the Texas Instruments 1220 20-bit digital to analog converter. To form dots, the screening gates were grounded, a voltage of 2.8 V was applied to the accumulation gates ($L/RA_{1/2}$), and the plunger gates ($P_{1/2}$) were set to ~2:1 V. For QD1, the depletion gates ($L/RD_1$) were set to ~0.8 V to realize relatively low tunnel barriers and a device current on the order of 100 pA. In contrast, the tunnel barriers for QD2 were made larger by applying a voltage of ~0.1 V, giving a tunnel rate ~10 Hz for QD2 to the left electrode and no tunneling to the right electrode, as described in the text. The plunger gates $P_{1/2}$ were then tuned on the mV scale to modulate the chemical potentials of the dots relative to the source and drain electrodes. For QD1, an attempt was made to align the chemical potential to the electrodes by maximizing the observed DC current at a finite bias. To measure the current hysteresis, a sinusoidal AC voltage with a frequency of 1 Hz was applied to the source of QD1 (L) and one of the depletion gates of QD2 ($LD_2$). AC and DC voltages were applied simultaneously to LD2 using a custom-built voltage adder based on an AD797B ultralow-noise operational amplifier. The circuit bandwidth was ~2 Hz due to RC filters on the lines connecting the external sources to the device, which limited the frequency of the applied voltage to <2 Hz. The 10 mV AC signal was applied directly to $LD_2$, but reduced by a factor of 10 using a voltage divider before being applied to L. The current through QD1 was amplified using a DL Instruments 1211 current-voltage preamplifier and then input to a Tektronix DPO 7104 oscilloscope. The oscilloscope recorded traces of length 10 s, with a sampling rate of 1 kS/s.

Figure 9:
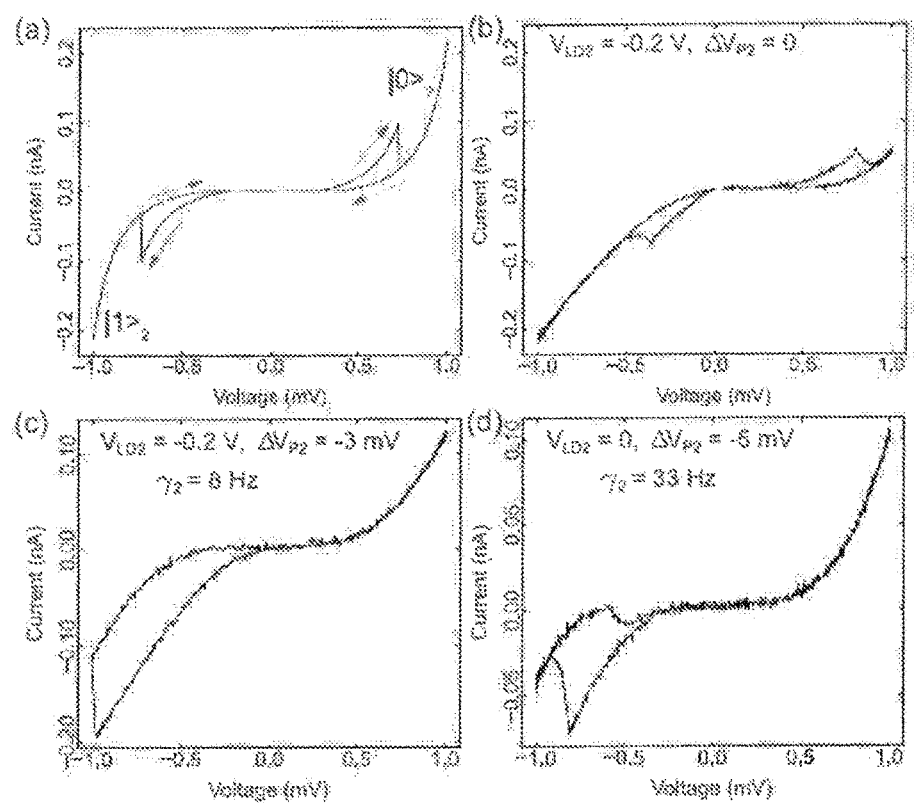
FIG. 9 illustrates simulated and experimental I-V curves showing current hysteresis in the Si double dot system which is the subject of FIG. 1(b).

FIG. 9 shows simulated and experimental I-V curves showing current hysteresis in this Si double dot system. FIG. 9(a) shows a simulated I-V curve of QD1 for one sinusoidal voltage cycle with $V_A=1$ mV. The suppression of current near zero bias is due to a weak, unintentional potential barrier in series with QD1. The arrows relate the curves to the voltage sweep direction. $|0\rangle_2$ and $|1\rangle_2$ indicate the charge state of QD2. FIGS. 9(b-d) show the measured current through QD1 for one voltage cycle with $\omega=2\pi\times 1$ Hz. FIG. 9(b) shows the measured two-looped hysteresis showing similar behavior as in FIG. 9(a). FIG. 9(c) shows that the position of the hysteresis was shifted to negative bias by lowering $V_{P2}$ which changed the energy level $E_2$ in QD2. $\Delta V_{P2}$ denotes the difference in voltage applied to $V_{P2}$, relative to when the hysteresis was symmetric about zero bias. FIG. 9(d) shows that raising the DC voltage on $LD_2$ lowered the tunnel barrier and increased $\gamma_2$, causing the hysteresis width to narrow. The estimated tunnel rates $\gamma_2$ for FIGS. 9(c) and 9(d) were 8 Hz and 33 Hz, respectively.

FIG. 9 shows the I-V responses for a single voltage cycle (in contrast to the average current presented in FIG. 2 that would correspond to an average over many cycles). For all results shown in FIG. 9, a sweep rate of $w=2\pi\times 1$ Hz and sweep amplitude $V_A=1$ mV were used, and the current through QD1 is displayed. FIG. 9(b) shows hysteresis that is symmetrical about V=0, indicating that energy $E_2$ of QD2 was aligned with p at zero bias. FIG. 9(a) is a simulated trace using Equations (7) and (8) with instantaneous switching of the charge state of QD2 chosen to match the data in FIG. 9(b). For a single cycle, sharp jumps in current occur when the charge state of QD2 changes. While these jumps are perfectly sharp in simulation (FIG. 9(a)), they were slightly rounded in the experiment (FIGS. 9(b)(c)(d)) due to the limited bandwidth of the RC filtering employed in the experimental circuit.

Tuning the DC voltages applied to QD2 varied the hysteresis shape in two distinct ways. The plunger gate $P_2$ controlled the value of $E_2$. This changed the position of the dot level relative to $\mu_B$ so that a different value of $\mu_L$ was required to change the charge state of QD2. The position of the hysteresis loop was thus shifted along the I-V curve, as shown in FIG. 9(c). This confirmed that the current jumps in the current of QD1 were due to charge transitions on QD2. If QD2 is detuned far enough, the voltage V would no longer be sufficient to cause the dot level to cross $\mu_B$ and no hysteresis would be observed.

Current was suppressed at low bias due to a weak unintentional barrier in series with QD1. This device imperfection was included in the model by considering the dot and tunnel barrier as two voltage dependent resistors in series. The I-V curve was calculated from the total resistance, which changed as a function of V depending on how the voltage was dropped across the two resistors. The resistance of the dot $R_d(V_d)$ was calculated from Equations (7) and (8) using R=1/G. For the tunnel barrier, resistance $R_b(V_b)$ was calculated for transmission through a square barrier with a height of 0.3 meV and a width of 40 nm (which were the best fit parameters). $V_d$ and $V_b$ (the voltages dropped across the dot and barrier, respectively), were related to the bias voltage by $V=V_d+V_b$. Comparison of FIGS. 9(a) and 9(b) showed that this model reproduced the experimental data well. If the effect of the tunnel barrier resistance is removed and the I-V response of the double dot system is plotted instead, a curve similar to FIG. 2B(a) was obtained, but with stochastic jumps rather than an average current.

As electrode-B did not have an energy gap in this device, it was required that the tunneling rate $\gamma_2$ must be in the correct frequency range in order to observe the memristive hysteresis effect, i.e. roughly comparable to sweep rate $\omega$. The width of the hysteresis loop was modulated by adjusting $\gamma_2$, using the DC voltage on the depletion gate $LD_2$. This can be seen in FIGS. 9(c) and 9(d), where a more positive voltage in (d) increased the tunneling rate and the charge transitions occurred closer together. If the tunnel rate were further increased the hysteresis would eventually disappear. The rate $\gamma_2$ can be estimated for a given I-V curve as the ratio of the average voltage sweep rate to the distance between the two charge transitions: $\gamma_2 = 2V_a\omega/(\pi\Delta V_{hyst})$, where $\Delta V_{hyst}$ is the hysteresis width. For the curves in FIGS. 9(c)(d), tunneling rates of 8 Hz and 33 Hz were estimated, respectively.

EXAMPLE 10

As described in Example 9, a device imperfection led to a small tunnel barrier in series with QD1. To properly match the experimental results it was necessary to calculate the barrier resistance as a function of the voltage across it. The resistance was found using Ohm's law: $R_b(V_b)=M_b$, where $R_b$ is the resistance, $I_b$ is the current, and $V_b$ is the voltage. Current was calculated using the equation for transport between two thermally populated reservoirs:

$$I_b = \frac{|e|}{h} \int_{-\infty}^{\infty} D(E)\left[f\left(E - \frac{V_b}{2}\right) - f\left(E + \frac{V_b}{2}\right)\right] dE$$

where E is the energy and D(E) is the transmission coefficient. For simplicity, current was calculated for a square barrier, which has a transmission coefficient of:

$$D(E) = \exp\left(-\frac{4\pi s}{h}\sqrt{2m^*(\varphi - E)}\right)$$

where s is the width of the barrier, m* is the effective mass of the electron in Si, and $\varphi$ is the height of the barrier in eV. The best match to the experimental data was found for s=40 nm and $\varphi$=0.3 meV.

We claim:

1. A quantum memristor, comprising:
   a first quantum dot (QD1) which is capacitively coupled to a second quantum dot (QD2),
   a source electrode,
   a drain electrode, and
   a bath electrode,
   wherein said source electrode and said drain electrode are coupled via quantum tunneling to QD1 and said bath electrode is coupled via quantum tunneling to QD2, and wherein QD2 is capacitively coupled to either the source electrode or the drain electrode.

2. A quantum memristor according to claim 1, wherein QD1 and QD2 are of the same material as one another.

3. A quantum memristor according to claim 1, wherein QD1 and QD2 are of different materials to one another.

4. A quantum memristor according to claim 1, wherein QD1 and QD2 are the same size and/or shape as one another.

5. A quantum memristor according to claim 1, wherein QD1, the source electrode and the drain electrode are formed from a single piece of material and wherein QD1 is defined by a first constriction and a second constriction in said single piece of material, said first constriction being located between QD1 and the source electrode and said second constriction being located between QD1 and the drain electrode; and wherein QD2 and the bath electrode are formed from a single piece of material and wherein QD2 is defined by a constriction in said single piece of material located between QD2 and the bath electrode; wherein said constrictions between QD1 and the source and drain electrodes and between QD2 and the bath electrode act as tunnel barriers.

6. A quantum memristor according to claim 5, wherein said constrictions are produced lithographically.

7. A quantum memristor according to claim 1, wherein QD1 and QD2 are in lithographically-defined channels and wherein tunneling barriers between QD1, the source electrode and the drain electrode, and between QD2 and the bath electrode, are provided by gate electrodes.

8. A quantum memristor according to claim 1, wherein QD1 and QD2 are regions in a two-dimensional electron/hole gas which are defined by barrier gates and plunger gates and wherein QD1 is separated from the drain and reservoir electrode by electrode gates.

9. A quantum memristor according to claim 8 wherein said two-dimensional electron/hole gas is a patterned semiconductor material.

10. A quantum memristor according to claim 9 wherein said two-dimensional electron/hole gas is a semiconductor heterostructure.

11. A quantum memristor according to claim 1, wherein QD1 and QD2 are each independently a single atom, molecule or nanoparticle.

12. A quantum memristor according to claim 1, wherein the bath electrode has a nonzero energy gap.

13. A multiple quantum-dot memristor comprising two or more quantum memristors as defined in claim 1, wherein said two or more quantum memristors are arranged in parallel.

14. A computer-readable storage medium comprising at least one quantum memristor according to claim 1.

15. A method for the storage of information in a quantum memristor, the method comprising:
   providing a quantum memristor as defined in claim 1 wherein QD2 has a first occupancy level;
   and applying a voltage across the first and second electrodes to cause the occupancy level of QD2 to change to a second occupancy level;
   wherein changing the occupancy level of QD2 from the first to the second occupancy level corresponds to the storage of at least one bit of information.

16. A method according to claim 15 wherein said information is binary information.

17. A method according to claim 16 wherein one of said first and said second occupancy levels of QD2 corresponds to a 1 in binary language and the other of said first and said second occupancy levels of QD2 corresponds to a 0 in binary language.

18. A method according to claim 15 wherein said information is quantum information.

19. A method according to claim 18 wherein changing the occupancy level of QD2 from the first to the second occupancy level corresponds to the storage of at least one qubit.

20. A method according to claim 15 wherein said storage of information is in a computer system.

21. A method according to claim 20 wherein said computer system comprises a quantum computer.

22. A computer-readable storage medium comprising at least one multiple quantum dot memristor according to claim 13.

\* \* \* \* \*